(12) United States Patent
Kim et al.

(10) Patent No.: US 6,265,261 B1
(45) Date of Patent: Jul. 24, 2001

(54) SEMICONDUCTOR DEVICE AND FABRICATING METHOD THEREFOR IN WHICH A NETRIDE LAYER IN A CAPACITOR IS FORMED IN A SHORTENED TIME PERIOD

(75) Inventors: Ki-Young Kim, Suwon; Kyoung-Ho Hyon, Seoul; Joong-Il An; Byung-Su Koo, both of Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/497,498

(22) Filed: Feb. 4, 2000

(30) Foreign Application Priority Data

Sep. 15, 1999 (KR) .................................................. 99-39484

(51) Int. Cl.[7] .............................. H01L 21/00; H01L 21/44
(52) U.S. Cl. ........................ 438/253; 438/255; 438/591; 438/762; 438/954
(58) Field of Search ..................................... 438/254, 253, 438/255, 763, 954, 591, 762, 923

(56) References Cited

U.S. PATENT DOCUMENTS

| | | | |
|---|---|---|---|
| 5,422,291 | * 6/1995 | Clementi et al. | 437/43 |
| 5,504,021 | * 4/1996 | Hong et al. | 437/42 |
| 5,629,221 | * 5/1997 | Chao et al. | 438/591 |
| 5,953,608 | * 9/1999 | Hirota | 438/253 |

* cited by examiner

Primary Examiner—Richard Elms
Assistant Examiner—Michael S Lebentritt
(74) Attorney, Agent, or Firm—Jones Volentine, LLC

(57) ABSTRACT

A method of fabricating a semiconductor device includes nitriding a native oxide layer on a pattern of polysilicon layers to be used as the lower electrode of a capacitor in LPCVD equipment at a constant temperature in an environment of ammonia gas. A nitride layer is then deposited onto the nitrided native oxide layer in the in-situ state. An oxide layer is then deposited onto the entire nitride layer, and thereafter a pattern of upper electrodes are formed on the oxide layer, thereby shortening the period of time required for forming the entire nitride layer of the NO dielectric layer without any deterioration in the product quality.

3 Claims, 4 Drawing Sheets

US 6,265,261 B1

SEMICONDUCTOR DEVICE AND FABRICATING METHOD THEREFOR IN WHICH A NETRIDE LAYER IN A CAPACITOR IS FORMED IN A SHORTENED TIME PERIOD

BACKGROUND OF THE INVENTION

1. Field of the Invention

The present invention relates to a method of fabricating a semiconductor device, and more particularly to a method in which the period of time for forming a nitride layer of a capacitor having an NO (nitride-oxide) dielectric layer is shortened.

2. Background of the Related Art

In general, as the integration of semiconductor memory devices (e.g., DRAMs) increases, the dimensions of the memory cells and the capacitors of the device decrease. Accordingly, as the capacitance of the capacitor of the memory cells is reduced, it becomes more difficult to achieve a capacitance sufficiently high enough to prevent product reliability problems in the semiconductor memory device.

In order to solve the aforementioned problem, researchers have concentrated on methods such as expanding the valid area of the capacitor, utilizing a dielectric layer having a high dielectric constant, or thinning the dielectric layer itself. In order to expand the valid area of the capacitor, an ONO (native oxide-nitride-top oxide) dielectric layer, which is a multiple insulating layer, has been utilized in constructing the semiconductor device in the deposition structure, instead of the planar structure.

However, there are some drawbacks to this method. If the thickness of the nitride layer is decreased in the process of forming the ONO dielectric layer of the capacitor, the internal oxidation pressure of the top oxide layer reduces product reliability. If the thickness of the oxide layer is decreased while forming the ONO dielectric layer of the capacitor, the leakage current increases. In this regard, there have been limitations in forming the ONO layer at a thickness of less than 50 Å.

In order to solve the limitations described above, an NO (nitride-oxide) layer has been substituted for the conventional ONO dielectric layer. In other words, $NH_3$ gas is used in low pressure chemical vapor deposition (LPCVD) equipment to nitride a native oxide layer on a pattern of polysilicon layers to be used as the lower electrode of the capacitor in the in-situ state into a $Si_3N_4$ layer, which will help shorten the incubation time at the following step of forming a nitride layer. Then, the nitride layer is deposited on the $Si_3N_4$ layer in the in-situ state to thereby complete the formation of a preferred nitride layer as a whole, and an oxide layer is further deposited onto the nitride layer to complete the formation of a dielectric layer having the NO structure of the dielectric layer.

However, as shown in FIG. 1, after the step of forming the pattern of polysilicon layers to be used as the lower electrode, the silicon substrate is transferred into a boat of the LPCVD equipment, and the boat is further loaded onto a tube as the temperature of the tube is increased to 650° C. from the standby temperature of 550° C. When the boat is completely loaded, the temperature of the tube is increased to 780° C. (T1) in preparation for nitriding the native oxide layer on the pattern of polysilicon layers to be used as the lower electrode. Ammonia gas is then allowed to flow into the tube for nitriding the native oxide layer on the polysilicon layer to be used as the lower electrode. Afterwards, the temperature T1 of the tube is decreased to 670° C. (T2) for depositing the nitride layer in the in-situ state.

However, since T1 is higher than T2, gaseous particles are easily activated in the tube at T1. A great deal of pumping time has been required for decreasing the pressure of the tube to the base vacuum level before commencing the nitriding of the native oxide. In addition, a predetermined period of time has been required for increasing the temperature of the tube to T1 and for decreasing the temperature of the tube from T1 to T2. Consequently, a great deal of time has been taken for completing the formation of the entire nitride layer which makes up the lower portion of the NO dielectric layer of the capacitor.

SUMMARY OF THE INVENTION

Therefore, it is an object of the present invention to provide a method of fabricating a semiconductor device which shortens the period of time required for forming an entire nitride layer of an NO dielectric layer without reducing the quality of the NO dielectric layer.

In order to accomplish the aforementioned object of the present invention, there is provided a method of fabricating a semiconductor device comprising the steps of: forming a pattern of polysilicon layers to be used as the lower electrode of a capacitor on the silicon substrate; forming an entire nitride layer by nitriding a native oxide layer on the pattern of polysilicon layers at a predetermined temperature in the LPCVD process and then depositing a nitride layer onto the nitrided native oxide layer in the in-situ state at the same temperature as the aforementioned predetermined temperature; depositing an oxide layer onto the entire nitride layer; and forming a pattern of upper electrodes on the oxide layer.

It is preferable that the native oxide layer be nitrided at a temperature of 670° C. Also, the pressure for nitriding the native oxide layer should be kept at more than 40 Pa. Therefore, according to the present invention, the native oxide layer on the pattern of polysilicon layers to be used as the lower electrode of the capacitor is nitrided in the LPCVD equipment at a constant temperature in the environment of ammonia gas, and the nitride layer is deposited onto the nitrided native oxide layer in the in-situ state, thereby shortening the period of time for forming the nitride layer of the NO dielectric layer.

BRIEF DESCRIPTION OF THE ATTACHED DRAWINGS

The accompanying drawings, which are included to provide a further understanding of the invention and are incorporated in and constitute a part of this specification illustrate an embodiment of the invention, in which.

DETAILED DESCRIPTION OF PREFERRED EMBODIMENTS

Hereinafter, a method of fabricating a semiconductor device of the present invention will be described in detail with reference to the accompanying drawings.

Figure 2:
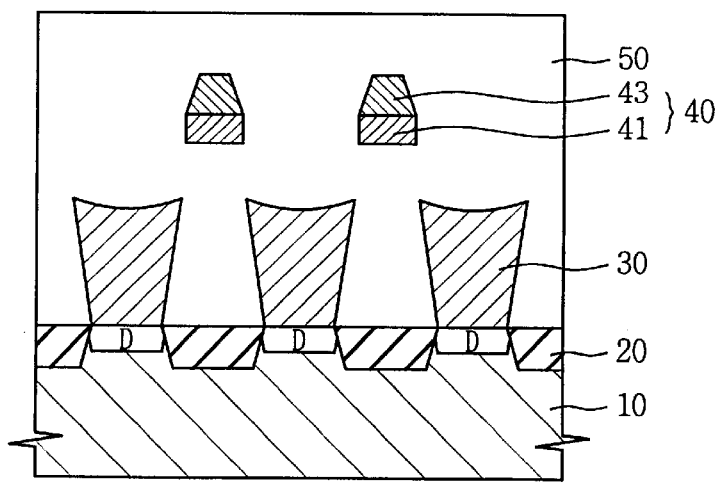
FIG. 2 through 6 are diagrams illustrating sequential processes of fabricating a semiconductor device in accordance with the present invention.

First, as shown in FIG. 2, in order to isolate an active area of the first conductivity P type silicon substrate 10, a field oxide layer 20 is formed, for instance by an STI (shallow trench isolation) process, at a field area of the substrate 10. Then, a gate oxide layer (not shown) is grown at a predetermined portion of the active area of the silicon substrate 10, and a gate electrode (not shown) is formed at a predetermined portion of the gate oxide layer.

After completing the formation of the gate electrode, the gate electrode is used as a mask to form an LDD (lightly doped drain) area by ion-implanting an impurity of a second conductivity N type, for instance phosphorus, to the active area in a low density. Then, an insulating layer to be used as a spacer (not shown) is deposited thickly all over the silicon substrate 10, and then etched back for exposing the active area, so that the spacers are completely formed at both lateral walls of the gate electrode. Furthermore, the gate electrode and the spacer are used as a mask for ion-implanting phosphorus to the active area in a high density to form sources (not shown) and drains (D).

After formation of sources and drains, a polysilicon layer, to be used for cell pads, is deposited on the resultant structure described above. A photo etching process is applied to leave only the polysilicon layer of the drains (D) to be the pattern of cell pads 30 and to etch away the rest of the polysilicon layer. After formation of the cell pads 30, empty spaces between the cell pads 30 are completely filled by depositing a first inter-level insulating layer, for instance a BPSG layer to a level higher than the cell pads, on the resultant structure described above, and then planarizing the surface thereof by a chemical and mechanical process.

In addition, the photo etching process is applied for forming contact holes (not shown) at the first inter-level insulating layer for electrical connection between sources and bit lines 40. Then, a blocking metal layer 41 made of Ti/TiN and any other refractory, for instance a tungsten layer 43, are sequentially deposited over the first inter-level insulating layer as well as the internal portion of the contact holes. The photo etching process is utilized for forming a pattern of bit lines 40 by leaving the tungsten layer 43 and the blocking metal layer 41 of the area where the field oxide layer 20 is positioned between the cell pads 30 and removing the rest of the tungsten layer 43 and the blocking metal layer 41.

After the bit lines 40 are completely formed, a thick second inter-level insulating layer made of the same material as the first inter-level insulating layer is deposited; and an etch back process is then applied for flattening the surface of the resultant structure described above to form an inter-level insulating layer 50 including the first and second inter-level insulating layers.

Figure 3:
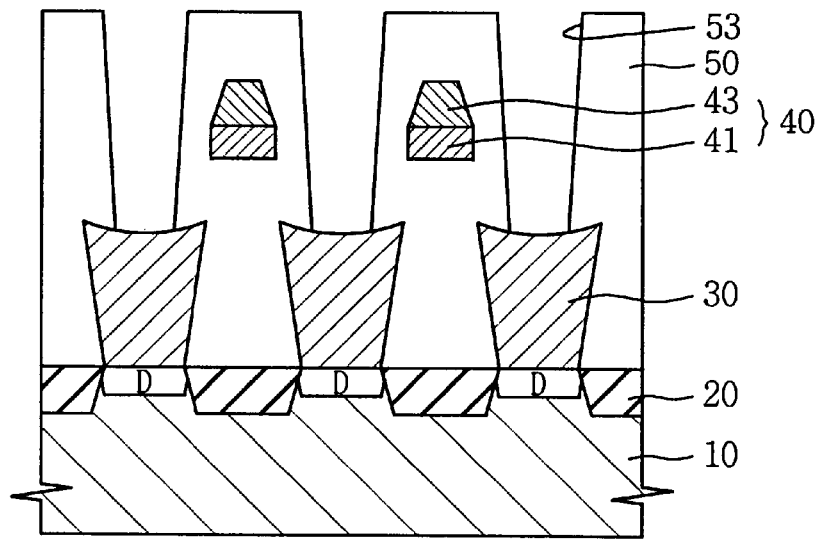

As shown in FIG. 3, after the formation of the inter-level insulating layer 50, a common photo etching process is utilized for etching out the inter-level insulating layer 50 of the buried contacting part to expose the cell pads 30, thereby forming buried contact holes 53.

Figure 4:
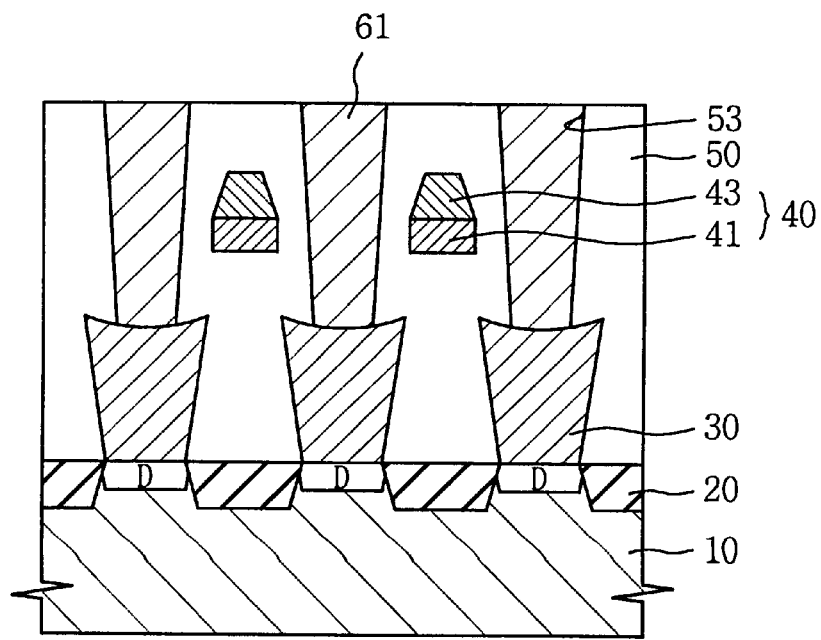

As shown in FIG. 4, the buried contact holes 53 are completely filled for electrical contact with the cell pads 30. The polysilicon layer 61 is deposited on the inter-level insulating layer 50 at a thickness necessary for forming a bar to be used as a lower electrode shown in FIG. 5 in the following process. Accordingly, the etch back process or the chemical mechanical process is applied for leaving the polysilicon layer 61 to be the bar for the lower electrode only in the buried contact holes 53 and removing all of the polysilicon layer of the inter-level insulating layer 50 from the buried contact holes 53.

Figure 5:
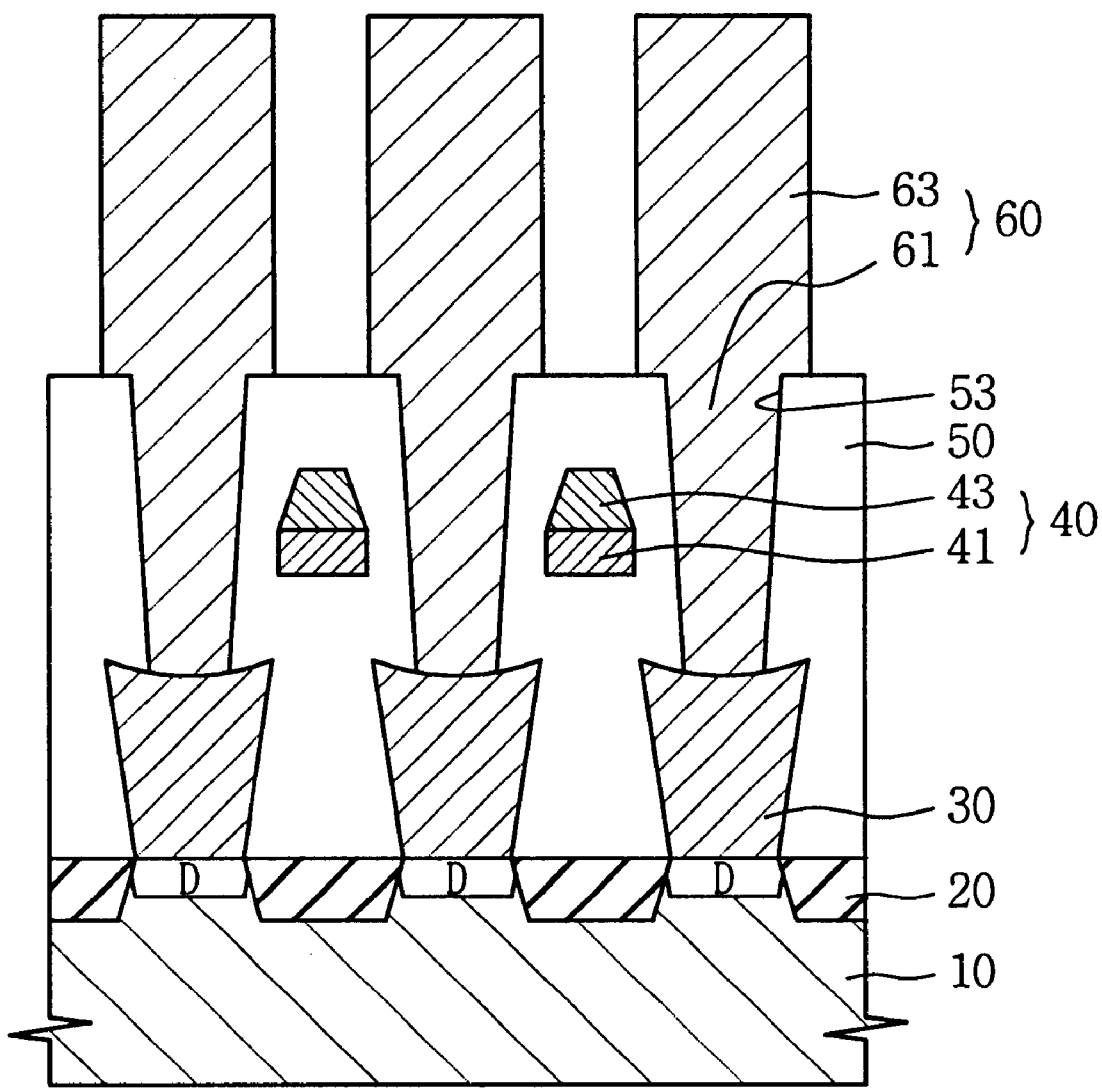

As shown in FIG. 5, a thick polysilicon layer 63 is deposited for forming the lower electrode of the capacitor. The photo etching process is applied for forming a pattern of polysilicon layers 63 which overlaps with the buried contact holes 53, thereby completing the pattern of polysilicon layers 60 to be used as the lower electrode by integrally connecting the polysilicon layer 63 and the polysilicon layer 61. At this time, a native oxide layer (not shown) is formed on the surface of the polysilicon layer 60.

Figure 6:
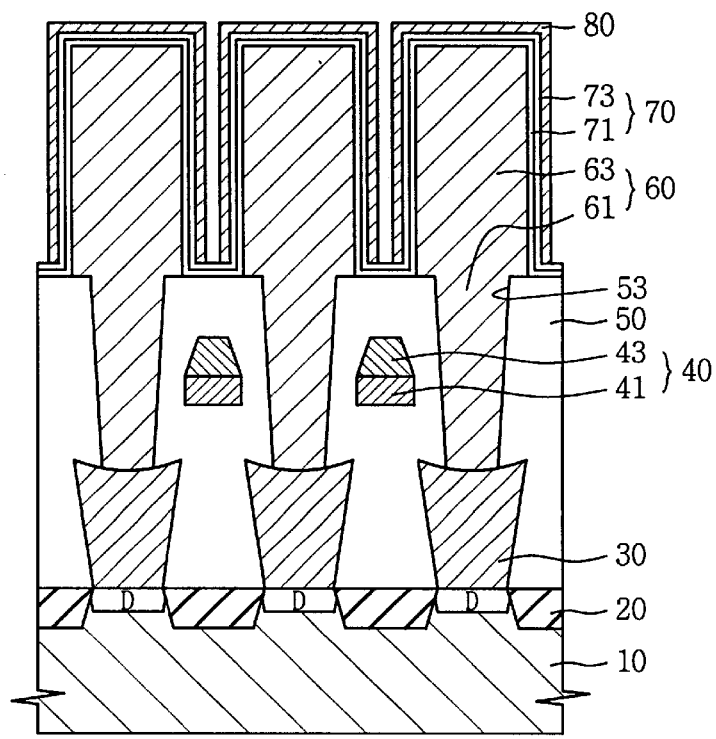
Figure 7:
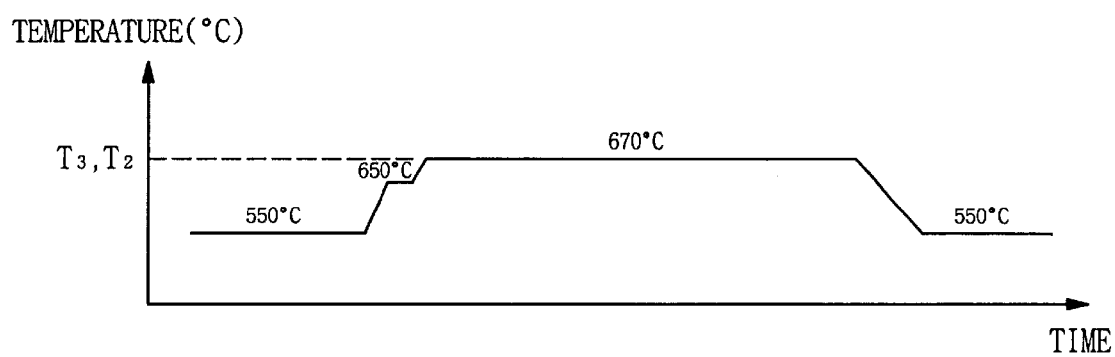
FIG. 7 is a graph illustrating the changes in temperature in the process of forming a nitride layer of a capacitor having an NO electric layer in accordance with the present invention.

As shown in FIG. 6, after the pattern of polysilicon layers 60 to be used as the lower electrode has been completely formed, the silicon substrate 10 is transferred into the LPCVD equipment (not shown). As shown in FIG. 7, the temperature of the tube is increased from the standby temperature to 650° C. in the course of loading the boat into the tube. After the boat is completely loaded, the temperature of the tube is further increased to 670° C. (T3) for nitriding the native oxide layer on the pattern of polysilicon layers 60 to be used as the lower electrode, and ammonia gas then flows into the tube to complete the nitriding of the native oxide layer on the pattern of polysilicon layers 60.

Then, the temperature of the tube is continuously kept at 670° C. (T2) in the process of depositing a nitride layer in the in-situ state to thereby complete the formation of the entire nitride layer 71.

Figure 1:
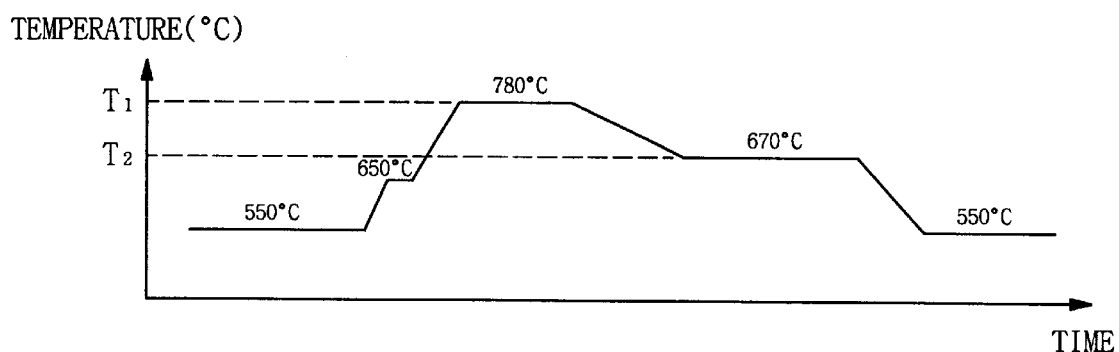
FIG. 1 is a graph illustrating the changes in temperature in the conventional process of forming nitride layer of a capacitor having an NO dielectric layer.

Therefore, since the temperature T3 of the tube for nitriding the native oxide layer on the pattern of polysilicon layers 60 is 670° C., which is much lower than the temperature of 780° C. in the conventional method shown in FIG. 1, it becomes difficult to activate the gaseous particles in the tube. In addition, according to the present invention, the pressure of the tube can be kept at more than 40 Pa before nitriding the native oxide layer, and, in comparison with the conventional method, only half of the pumping time may be required for decreasing the pressure of the tube to the base vacuum. Furthermore, since the temperature T3 of the tube is the same as the temperature T2 of the tube for deposition of the nitride layer in the present invention, no time is required for increasing the temperature of the tube over T3 to 780° C. and then decreasing it from 780° C. to T2 as in the conventional method.

Then an oxide layer 73 is deposited on the surface of the nitride layer to form the NO dielectric layer 70. Finally, the polysilicon layer 80 to be used as the upper electrode is deposited on the NO dielectric layer 70, and the photo etching process is then applied for forming a pattern of polysilicon layers 80 to be used as the upper electrode, thereby completing formation of the capacitor.

As described above, the method of fabricating the semiconductor device of the present invention includes the steps of nitriding a native oxide layer on a pattern of polysilicon layers to be used as the lower electrode of a capacitor in LPCVD equipment at a constant temperature in the environment of ammonia gas; depositing a nitride layer onto the nitrided native oxide layer in the in-situ state; further depositing an oxide layer onto the entire nitride layer; and forming a pattern of upper electrodes on the oxide layer, thereby shortening the period of time required for forming the entire nitride layer of the NO dielectric layer in the capacitor.

Therefore, there is an advantage in the present invention in that the period of time required for forming the entire nitride layer, which is the lower layer of the NO dielectric layer, can be shortened without any deterioration in the product quality.

Having described the present invention in detail with reference to the accompanying drawings, it should be understood that the present invention is not limited to the embodiment described, and that various changes and modifications may be effected therein by one skilled in the art without departing from the scope or spirit of the invention as defined in the appended claims.

What is claimed is:

1. A method of fabricating a semiconductor device comprising steps of:

forming a pattern of polysilicon layers to be used as a lower electrode of a capacitor on a silicon substrate;

forming an entire nitride layer on the polysilicon layers, comprising nitriding a native oxide layer on the pattern of polysilicon layers at a predetermined temperature in an LPCVD process, and depositing a nitride layer onto the nitrided native oxide layer in an in-situ state at a temperature which equals the predetermined temperature;

depositing an oxide layer onto the entire nitride layer; and forming a pattern of upper electrodes on the oxide layer.

2. The method as defined in claim 1, wherein the native oxide layer is nitrided at a temperature of 670° C.

3. The method as defined in claim 1, wherein the native oxide layer is nitrided at a pressure of more than 40 Pa.

* * * * *